(12) United States Patent
Gandikota et al.

(10) Patent No.: US 9,145,612 B2
(45) Date of Patent: Sep. 29, 2015

(54) DEPOSITION OF N-METAL FILMS COMPRISING ALUMINUM ALLOYS

(71) Applicant: Applied Materials, Inc., Santa Clara, CA (US)

(72) Inventors: Srinivas Gandikota, Santa Clara, CA (US); Xinliang Lu, Fremont, CA (US); Shih Chung Chen, Cupertino, CA (US); Wei Tang, Santa Clara, CA (US); Jing Zhou, Milpitas, CA (US); Seshadri Ganguli, Sunnyvale, CA (US); David Thompson, San Jose, CA (US); Jeffrey W. Anthis, San Jose, CA (US); Atif Noori, Saratoga, CA (US); Faruk Gungor, San Jose, CA (US); Dien-Yeh Wu, San Jose, CA (US); Mei Chang, Saratoga, CA (US); Xinyu Fu, Fremont, CA (US); Yu Lei, Foster City, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 13/930,194

(22) Filed: Jun. 28, 2013

(65) Prior Publication Data

US 2014/0017408 A1    Jan. 16, 2014

Related U.S. Application Data

(60) Provisional application No. 61/781,868, filed on Mar. 14, 2013, provisional application No. 61/668,807, filed on Jul. 6, 2012.

(51) Int. Cl.
*C23C 18/00*     (2006.01)
*C23C 16/08*     (2006.01)
(Continued)

(52) U.S. Cl.
CPC ............... *C23C 18/00* (2013.01); *C23C 16/08* (2013.01); *C23C 16/18* (2013.01); *C23C 16/45527* (2013.01); *C23C 16/45534* (2013.01); *C23C 16/45553* (2013.01)

(58) Field of Classification Search
None
See application file for complete search history.

(56) References Cited

U.S. PATENT DOCUMENTS 5,154,949 A    10/1992    Shindo et al.
5,186,718 A     2/1993    Tepman et al.
(Continued)

FOREIGN PATENT DOCUMENTS

KR    2008-0086661    9/2008
WO    WO-2007136186    11/2007

OTHER PUBLICATIONS

Glass—Chem Mater 1992 v4 p. 530-538.*
(Continued)

*Primary Examiner* — Joseph Miller, Jr.
(74) *Attorney, Agent, or Firm* — Servilla Whitney LLC

(57) ABSTRACT

Provided are methods of depositing films comprising alloys of aluminum, which may be suitable as N-metal films. Certain methods comprise exposing a substrate surface to a metal halide precursor comprising a metal halide selected from $TiCl_4$, $TaCl_5$ and $HfCl_4$ to provide a metal halide at the substrate surface; purging metal halide; exposing the substrate surface to an alkyl aluminum precursor comprising one or more of dimethyaluminum hydride, diethylhydridoaluminum, methyldihydroaluminum, and an alkyl aluminum hydrides of the formula $[(CxHy)_{3-a}AlH_a]_n$, wherein x has a value of 1 to 3, y has a value of 2x+2, a has a value of 1 to 2, and n has a value of 1 to 4; and exposing the substrate surface to an alane-containing precursor comprising one or more of dimethylethylamine alane, methylpyrrolidinealane, di(methylpyrolidine)alane, and trimethyl amine alane borane. Other methods comprise exposing a substrate surface to a metal precursor and trimethyl amine alane borane.

18 Claims, 9 Drawing Sheets

(51) Int. Cl.
*C23C 16/18* (2006.01)
*C23C 16/455* (2006.01)

(56) References Cited

U.S. PATENT DOCUMENTS

| | | | |
|---|---|---|---|
| 5,980,978 A | 11/1999 | Jones et al. | |
| 2007/0045856 A1 | 3/2007 | Vaartstra et al. | |
| 2008/0194106 A1* | 8/2008 | Oh et al. | 438/685 |
| 2008/0233742 A1 | 9/2008 | Kim et al. | |
| 2009/0315093 A1 | 12/2009 | Li et al. | |
| 2011/0073832 A1* | 3/2011 | Lim et al. | 257/4 |

OTHER PUBLICATIONS

Kang—Thin Solid Films V518 2010 p. 2228-2233.*
Ludviksson CVD V4 1998 p. 129.*
Kim, B. et al., "Microstructure and Deposition Rate of Aluminum Thin Films from Chemical Vapor Deposition with Dimethylethylamine Alane", *Applied Physics Letters*, Jun. 17, 1996, vol. 68, No. 25, pp. 3567-3569.
PCT International Search Report and Written Opinion in PCT/US2013/049266, mailed Oct. 10, 2013, 13 pgs.
PCT International Preliminary Report on Patentability in PCT/US2013/049266, mailed Jan. 15, 2015, 9 pages.

* cited by examiner

DEPOSITION OF N-METAL FILMS COMPRISING ALUMINUM ALLOYS

CROSS-REFERENCE TO RELATED APPLICATIONS

This application claims priority to U.S. Provisional Application Nos. 61/781,868, filed Mar. 14, 2013 and 61/668,807, filed Jul. 6, 2012, the entire contents of which are hereby incorporated by reference.

TECHNICAL FIELD

Embodiments of the present invention generally relate to film deposition, and specifically to the deposition of N-metal films.

BACKGROUND

Deposition of thin films on a substrate surface is an important process in a variety of industries including semiconductor processing, diffusion barrier coatings and dielectrics for magnetic read/write heads. In the semiconductor industry, in particular, miniaturization requires atomic level control of thin film deposition to produce conformal coatings on high aspect structures. For example, TiAl is a film that has been used in planar high-k metal gates in 45 nm to 20 nm.

Planar high-k metal gates require materials that have a band edge work function. 3-D High-k metal gate (Multi gate, FinFETs, Trigates) require conformally deposited materials that have work function between quarter gap to band edge (4.4 eV to 4.0 eV). The work function can be tuned by controlling the thickness of the films. However, because the volume available for low resistivity fill is limited, the thickness of the film is also limited. Thus, there is a need for films comprising materials with a lower resistivity of the work function. If the materials have low resistivity and band edge work function, a thinner film can be used to meet the targets.

SUMMARY

One aspect of the invention relates to a method of depositing an N-metal film. The method comprises exposing a substrate surface to a metal precursor comprising a metal halide selected from $TiCl_4$, $TaCl_5$ and $HfCl_4$ to provide a metal halide terminated substrate surface; purging unreacted metal halide from the chamber; exposing the substrate surface to an alkyl aluminum precursor, the alkyl aluminum precursor comprising one or more of dimethyaluminum hydride, diethylhydridoaluminum, methyldihydroaluminum, and alkyl aluminum hydrides of the following formula $[(C_xH_y)_{3-a}AlH_a]_n$, wherein x has a value of 1 to 3, y has a value of 2x+2, a has a value of 1 to 2, and n has a value of 1 to 4; and exposing the substrate surface to an alane-containing precursor comprising one or more of dimethylethylamine alane, di(methylpyrolidine)alane and methylpyrrolidinealane to provide an N-metal film comprising TiAl, TaAl or HfAl.

Another aspect of the invention relates to a method of depositing an N-metal film, the method comprising exposing a substrate surface to a metal halide precursor comprising a metal halide selected from $TiCl_4$, $TaCl_5$ and $HfCl_4$ to provide a metal halide at the substrate surface; purging metal halide; exposing the substrate surface to an alkyl aluminum precursor comprising one or more of dimethyaluminum hydride, diethylhydridoaluminum, methyldihydroaluminum, and an alkyl aluminum hydrides of the formula $[(C_xH_y)_{3-a}AlH_a]_n$, wherein x has a value of 1 to 3, y has a value of 2x+2, a has a value of 1 to 2, and n has a value of 1 to 4; and exposing the substrate surface to an alane-containing precursor comprising one or more of dimethylethylamine alane, methylpyrrolidinealane, di(methylpyrolidine)alane, and trimethyl amine alane borane or a compound having a structure represented by:

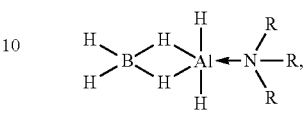

wherein each R is independently C1-C6 alkyl to provide an N-metal film comprising TiAl, TaAl or HfAl. In some embodiments, each R is methyl. In one or more embodiments the exposure to the alkyl aluminum precursor and alane-containing precursor can be simultaneous or sequential or mostly sequential with some overlap. The substrate surface may be exposed to either precursor before the other in embodiments featuring sequential exposures. In one or more embodiments, the method further comprises exposing the substrate surface to a fourth precursor comprising one or more of dimethylethylamine, dimethylcyclohexylamine or pyrrolidine alane during exposure to of the substrate to the third precursor.

Another aspect of the invention pertains to a method of depositing an aluminum alloy film, the method comprising exposing a substrate surface to a metal precursor comprising a metal halide selected from $TiCl_4$, $TaCl_5$ and $HfCl_4$ to provide a metal halide terminated substrate surface; and exposing the substrate surface to trimethyl amine alane borane. In one or more embodiments, the deposited film comprises TiAl, TaAl, or HfAl. In one or more embodiments, the film further comprises boron. In some embodiments, the aluminum alloy film may further comprise boron. The substrate surface may be exposed to TMAAB or TMAAB derivative and metal precursor either simultaneously or substantially simultaneously. In one or more embodiments, a substrate surface may be exposed to $TiCl_4$ and TMAAB or TMAAB derivative sequentially to deposit a film comprising TiAl. In some embodiments, the film further comprises boron.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1A:
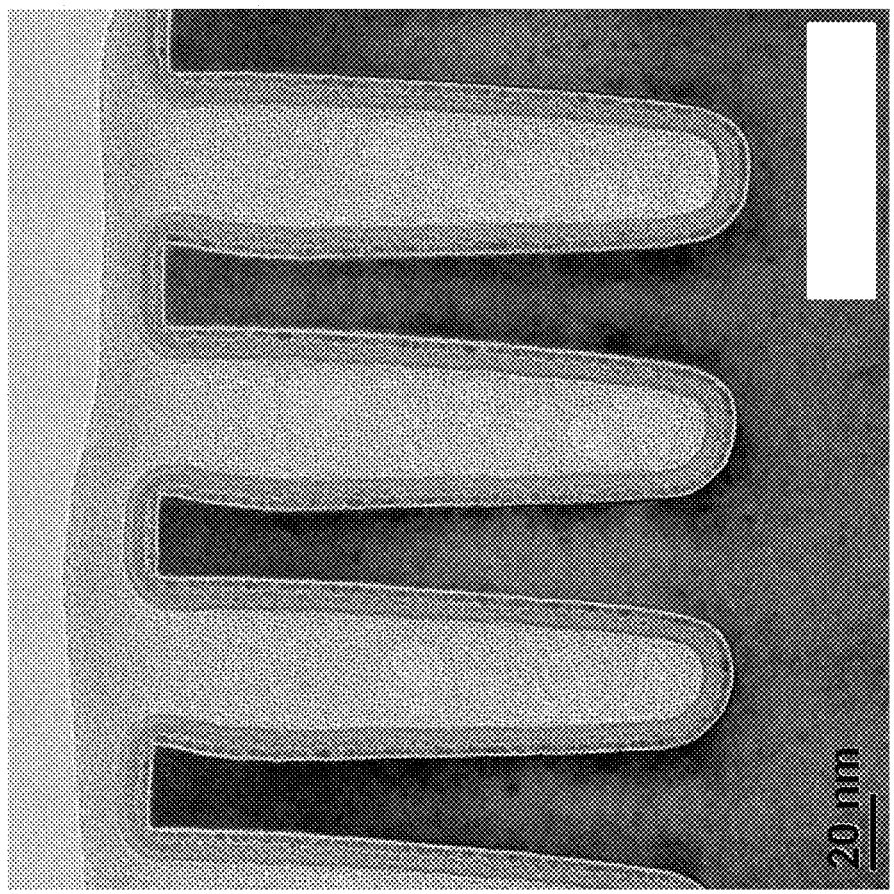
FIGS. 1A-C are a TEM images of films deposited according to one or more embodiments of the invention.

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention any of the film processing steps disclosed may also be performed on an underlayer formed on the substrate as disclosed in more detail below, and the term "substrate surface" is intended to include such underlayer as the context indicates.

In accordance with various embodiments of the invention, provided are methods related to the deposition of aluminum metal alloys, which in one or more embodiments are suitable as N-metal films. In one or more embodiments, the N-Metals have a tunable work function. Generally, embodiments of the methods describe introducing a metal halide to a substrate surface, purging the metal halide, introducing an alane source chemistry, introducing an alkyl aluminum or alkyl aluminum hydride to the chamber, and purging the deposition reactor. Optionally, purging may take place subsequent to exposure of the substrate to alane and/or alkyl aluminum precursors. In one or more embodiments the films provided comprise one or more of TiAl, TaAl or HfAl with low carbon content.

Accordingly, one aspect of the invention relates to a method of depositing an N-metal film. The method comprises exposing a substrate surface to a metal precursor comprising a metal halide selected from TiCl$_4$, TaCl$_5$ and HfCl$_4$ to provide a metal halide terminated substrate surface; purging unreacted metal halide from the chamber; exposing the substrate surface to an alkyl aluminum precursor, the alkyl aluminum precursor comprising one or more of dimethyaluminum hydride, diethylhydridoaluminum, methyldihydroaluminum, and alkyl aluminum hydrides of the following formula $[(C_xH_y)_{3-a}AlH_a]_n$, wherein x has a value of 1 to 3, y has a value of 2x+2, a has a value of 1 to 2, and n has a value of 1 to 4; and exposing the substrate surface to an alane-containing precursor comprising one or more of dimethylethylamine alane, di(methylpyrrolidine)alane and methylpyrrolidinealane to provide an N-metal film comprising TiAl, TaAl or HfAl.

Embodiments of the films provided exhibit lower levels of carbon than previously encountered. In some embodiments, the carbon in the resulting film is less than about 20, 15, 10 or 5% atomic ratio. While not wishing to be bound to any particular theory, it is thought that there may be an interaction between the alkyl aluminum and amine, which leads to a monomer having a structure represented by R$_3$N→alkyl aluminum, such that the monomers are less susceptible to incorporating carbon. Thus, for example, if DMAH is used, then the monomer R$_3$N→DMAH would be formed.

While not wishing to be bound to any particular theory, it is thought that, in at least some embodiments, there is no direct reaction between the halide terminated surface and the alkyl aluminum. That is, it is thought that the alane removes the halide. As a result, it is thought that reduced levels of carbon are incorporated into the film. It is also thought that the alkyl aluminum functions one of two ways. The first possible route is that the alkyl aluminum deposits a conformal CVD aluminum film. In this case, the method may constitute a nanolaminate process of a Ti-rich TiAl film deposited by the alane-containing precursor, metal halide and alkyl aluminum precursor. Alternatively, it is possible that the alkyl aluminum precursor soaks the Ti-rich TiAl film deposited from the alane-containing precursor and metal halide with a thermally stably CVD aluminum source. The Ti-rich TiAl film is treated by the soaking to increase the aluminum content.

In one or more embodiments, the process above may proceed in various orders. For example, the alkyl aluminum precursor exposure may occur before or after exposure to the alane-containing precursor or vice versa. In other embodiments, they may be co-flowed.

Thus, for example, one aspect of the invention relates to a method of depositing an N-metal film. The method comprises: exposing a substrate surface to a metal halide precursor comprising a metal halide selected from TiCl$_4$, TaCl$_5$ and HfCl$_4$ to provide a metal halide at the substrate surface; purging metal halide; exposing the substrate surface to an alkyl aluminum precursor comprising one or more of dimethyaluminum hydride, diethylhydridoaluminum, methyldihydroaluminum, and an alkyl aluminum hydrides of the formula $[(C_xH_y)_{3-a}AlH_a]_n$, wherein x has a value of 1 to 3, y has a value of 2x+2, a has a value of 1 to 2, and n has a value of 1 to 4; and exposing the substrate surface to a third precursor comprising one or more of dimethylethylamine alane, methylpyrrolidinealane, di(methylpyrolidine)alane, and a compound having a structure represented by:

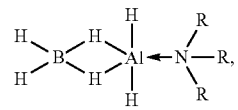

wherein each R is independently C1-C6 alkyl, to provide an N-metal film comprising TiAl, TaAl or HfAl. In some embodiments, each R is methyl.

In another aspect, the invention relates to a method of depositing an N-metal film, the method comprising: exposing a substrate surface to a metal halide precursor comprising a metal halide selected from TiCl$_4$, TaCl$_5$ and HfCl$_4$ to provide a metal halide at the substrate surface; purging metal halide; exposing the substrate surface to an alane-containing precursor comprising one or more of dimethylethylamine alane, di(methylpyrolidine)alane and methylpyrrolidinealane; exposing the substrate surface to an alkyl aluminum precursor comprising one or more of dimethyaluminum hydride, diethylhydridoaluminum, methyldihydroaluminum, and alkyl aluminum hydrides of the following formula $[(C_xH_y)_{3-a}AlH_a]_n$, wherein x has a value of 1 to 3, y has a value of 2x+2, a has a value of 1 to 2, and n has a value of 1 to 4 to provide an N-metal film comprising TiAl, TaAl or HfAl.

In one or more embodiments, the methods may further comprise purging the alane-containing precursor after the substrate surface is exposed to the alane-containing precursor. This can be done to remove excess precursor.

A third aspect of the invention relates to a method of depositing an N-metal film, the method comprising: exposing a substrate surface to a metal halide precursor comprising a metal halide selected from TiCl$_4$, TaCl$_5$ and HfCl$_4$ to provide a metal halide at the substrate surface; purging to remove metal halide not at the substrate surface; and simultaneously exposing the substrate surface to alkyl aluminum and alane-containing precursors, wherein the alane-containing precursor comprises one or more of dimethylethylamine alane, di(methylpyrolidine)alane and methylpyrrolidinealane, and the alkyl aluminum precursor comprises one or more of dimethyaluminum hydride, diethylhydridoaluminum, methyldihydroaluminum, and alkyl aluminum hydrides of the following formula $[(C_xH_y)_{3-a}AlH_a]_n$, wherein x has a value of 1 to 3, y has a value of 2x+2, a has a value of 1 to 2, and n has a value of 1 to 4 to provide an N-metal film comprising TiAl, TaAl or HfAl.

In yet other embodiments, alkyl aluminum and alane-containing precursors may be alternated, but feature some overlap in the flows. Thus, for example, in one or more embodiments, the exposure of the substrate surface to the alkyl aluminum at least partially overlaps with the exposure of the substrate surface to DMEAA.

Various embodiments of the invention relate to the use of alane (aluminum hydride or $AlH_3$) precursors coordinated to an amine. Alane is an unstable compound, but can be stabilized by coordination to an amine. Such precursors may be represented by the formula $AlH_3$—$NR_3$. These precursors may be synthesized according to the following equation 1:

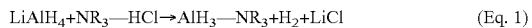

(Eq. 1)

Examples of such amines include, but are not limited to, dimethylethylamine alane (DMEAA), methylpyrrolidine alane (MPA), and di(methylpyrrolidine) alane (MP2A).

According to various embodiments of the invention, metal halides are also used as a precursor. The metals may be selected according to the desired metal film. In one in or more embodiments, the metal is selected from Ti, Ta and Hf. In one or more embodiments, the halide is selected from Cl, I and Br, such that the second precursor comprises a metal chloride, metal iodide or metal bromide. Thus, for example, the metal halide precursor may be selected from $TiCl_4$, $TaCl_5$ and $HfCl_4$.

The methods herein may feature additional sub-processes. For example, in one or more embodiments, the methods described above further comprise soaking the N-metal film with an alloying agent. As used herein, "soak" or "soaking" refers to a process wherein a substrate is exposed to a reactant gas, and the gas reacts with the surface, but does not deposit a layer. In further embodiments the alloying agent comprises one or more of $SiH_4$, $GeH_4$, trimethylgallium, and $B_2H_6$.

Other embodiments of the methods described herein may further comprise exposing the substrate surface to an amine, wherein the substrate surface is exposed to the amine while the substrate surface is exposed to the alkyl aluminum precursor and/or alane-containing precursor.

In some embodiments, the methods may further comprise exposing the substrate surface to a fourth precursor comprising one or more of dimethylethylamine, dimethylcyclohexylamine or pyrrolidine alane during exposure to of the substrate to the third precursor. In further embodiments, the amine is flowed at least during substrate exposure to the alane-containing precursor and/or alkyl aluminum precursor.

In one or more embodiments, the films are deposited using an ALD, CVD or PVD process. In embodiments relating to a CVD process, the substrate may be exposed to more than one precursor continuously simultaneously, or substantially simultaneously, as appropriate. As used herein, the term "substantially simultaneously" means that a majority of the flow of one component overlaps with the flow of another, although there may be some time where they are not co-flowed.

In other embodiments, films are deposited using an atomic layer deposition (ALD) process. Therefore, in one embodiment, contacting the substrate surface with two or more precursors occurs sequentially or substantially sequentially. As used herein, "substantially sequentially" means that a majority of the flow of one component does not coincide with the flow of another, although there may be some overlap. In a more specific embodiment, the method comprises metal halide exposure, followed by purge, followed by exposure to DMAH, followed by another purge, followed by exposure to DMAH, followed by yet another purge. In exemplary embodiment of an ALD process, a first chemical precursor ("A") is pulsed or flowed, for example, $TiCl_4$ or $TaCl_5$, to the substrate surface in a first half reaction. Excess reactants and the reaction by-products are removed, typically by an evacuation-pump down and/or by a flowing inert purge gas. Then a precursor "B", for example an DMAH, is delivered to the surface, wherein the precursors of the first half reaction are reacted with new ligands from the "B" precursor, creating an exchange by-product. The "B" co-reactant also forms self saturating bonds with the underlying reactive species to provide a saturating second half reaction. A second purge period is typically utilized to remove unused reactants and the reaction by-products. A "C" precursor, for example DMEAA, may then be flowed to react with the underlying species, and then excess "C" precursor removed. The "A," "B," and "C" precursors and purge gases can then again be flowed. The alternating exposure of the surface to reactants is continued until the desired thickness film is reached, which for most anticipated applications would be approximately in the range of 5 Å to 100 Å, and more specifically from about 15 Å, 20 Å, 25 Å or 30 Å to about 45 Å, 50 Å, 55 Å or 60 Å. It will be understood that the reactants and purge gases can flow simultaneously, and the substrate and/or gas flow nozzle can oscillate such that the substrate is sequentially exposed to the reactant and purge gases as desired. Of course, the aforementioned ALD cycles are merely exemplary of a wide variety of ALD process cycles in which a deposited layer is formed by alternating layers of precursors and/or co-reactants.

Table 1 below shows several non-limiting examples of method sequences. The sequences can be repeated to achieve the desired thickness of the resulting film.

TABLE 1

Exemplary Method Sequences

| Seq. | Precursor | | Precursor | | Precursor | |
|---|---|---|---|---|---|---|
| 1 | $TiCl_4$ | Purge | DMAH | Purge | DMEAA | Purge |
| 2 | $TiCl_4$ | Purge | DMAH | Purge | DMEAA + DMEA | Purge |
| 3 | $TiCl_4$ | Purge | DMAH | Purge | DMEAA + DMCA | Purge |
| 4 | $TiCl_4$ | Purge | DMEAA | Purge | DMAH | Purge |
| 5 | $TiCl_4$ | Purge | DMEAA + DMEA | Purge | DMAH | Purge |
| 6 | $TiCl_4$ | Purge | DMEAA + DMCA | Purge | DMAH | Purge |
| 7 | $TiCl_4$ | Purge | DMAH + DMEAA | Purge | | |
| 8 | $TiCl_4$ | Purge | DMAH + DMEAA + DMEA | Purge | | |
| 9 | $TiCl_4$ | Purge | DMAH + DMEAA + DMCA | Purge | | |

It should be noted that these sequences are only exemplary, and there are many variants as discussed above. For example, purging after exposure to DMAH in sequences 1-6 is optional, and in fact there may be overlap between the alkyl aluminum and alane-containing precursors. Indeed, sequences 7-9 show that these precursors may be co-flowed. Additionally, any of the metal halides discussed above can be used, including TaCl$_5$ and HfCl$_4$. Additionally, in lieu of DMAH, the alkyl aluminums discussed above can be used, such as diethylhydridoaluminum, methyldihydroaluminum, and alkyl aluminum hydrides of the following formula [(CxHy)3-aAlHa]n, wherein x has a value of 1 to 3, y has a value of 2x+2, a has a value of 1 to 2, and n has a value of 1 to 4. Additionally, the alane-containing precursors discussed above can be used instead of DMEAA, including MP2A and MPA. Furthermore, in embodiments utilizing MPA or MP2A, PA can be added as the fourth precursor instead of DMEA and/or DMCA.

The deposition process conditions may be any those suitable for the particular sequence being used. For example, in non-co-flow sequences (i.e., sequences 1-6 in Table 1), the deposition temperature may range from about 60, 65 or 70° C. to about 145, 150 or 155° C. In some embodiments, the metal halide may be flowed at a rate of from about 40, 50 or 60 sccm to about 90, 100 or 110 sccm with a chamber pressure of from about 2, 4, or 6 T to about 36, 38, 40 or 42 T. The purge and pump times may range from about 2, 4, or 6 seconds to about 18, 20 or 22 seconds. Exposure time may range from about 3, 5, or 7 seconds to about 48, 50 or 52 seconds. The alane-containing precursor may be flowed at a rate of about 450, 500 or 550 sccm to about 950, 1000 or 1050 sccm, with a chamber pressure of about 2, 4 or 6 T to about 38, 40 or 42 T. The purge and pump times may range from about 2, 4, or 6 seconds to about 18, 20 or 22 seconds. Exposure time may range from about 3, 5, or 7 seconds to about 18, 20 or 22 seconds. The alkyl aluminum precursor may be flowed at a rate of about 450, 500 or 550 sccm to about 950, 1000 or 1050 sccm, with a chamber pressure of about 2, 4 or 6 T to about 38, 40 or 42 T. The purge and pump times may range from about 2, 4, or 6 seconds to about 18, 20 or 22 seconds. In embodiments where a fourth precursor (i.e., DMEA or DMCA) is used, the precursor may be flowed at a rate of from about 40, 50 or 60 sccm to about 90, 100 or 110 sccm with a chamber pressure of from about 2, 4, or 6 T to about 36, 38, 40 or 42 T. In some embodiments, the fourth precursor may be flowed with the alane-containing precursor through the ampoule or may be mixed at the lid. In some embodiments, the purge and pump times will match those of the alane-containing precursor. In one or more embodiments, the film may undergo a post-deposition anneal at a temperature of about 250, 275 or 300° C. to about 450, 475, or 500° C.

In embodiments relating to co-flows (i.e., sequences 7-9 in Table 1), the deposition temperature may range from about 60, 65 or 70° C. to about 145, 150 or 155° C. In some embodiments, the metal halide may be flowed at a rate of from about 40, 50 or 60 sccm to about 90, 100 or 110 sccm with a chamber pressure of from about 2, 4, or 6 T to about 36, 38, 40 or 42 T. The purge and pump times may range from about 2, 4, or 6 seconds to about 18, 20 or 22 seconds. Exposure time may range from about 3, 5, or 7 seconds to about 48, 50 or 52 seconds. The alane and alkyl aluminum precursors may be co-flowed at a rate of about 450, 500 or 550 sccm to about 950, 1000 or 1050 sccm, with a chamber pressure of about 2, 4 or 6 T to about 38, 40 or 42 T. The purge and pump times may range from about 2, 4, or 6 seconds to about 18, 20 or 22 seconds. Exposure time may range from about 3, 5, or 7 seconds to about 18, 20 or 22 seconds. In embodiments with a fourth precursor, the conditions will follow as described above. In one or more embodiments, the film may undergo a post-deposition anneal at a temperature of about 250, 275 or 300° C. to about 450, 475, or 500° C.

The purge step removes any excess precursor, byproducts and other contaminants within the processing chamber. The carrier gas, the purge gas, or other process gas may contain nitrogen, hydrogen, argon, neon, helium, or combinations thereof.

The precursors and/or reactants may be in a state of gas or vapor or other state of matter useful for a vapor deposition process. During the purge, typically an inert gas is introduced into the processing chamber to purge the reaction zone or otherwise remove any residual reactive compound or by-products from the reaction zone. Alternatively, the purge gas may flow continuously throughout the deposition process so that only the purge gas flows during a time delay between pulses of precursor and co-reactants.

A deposition gas or a process gas as used herein refers to a single gas, multiple gases, a gas containing a plasma, combinations of gas(es) and/or plasma(s). A deposition gas may contain at least one reactive compound for a vapor deposition process. The reactive compounds may be in a state of gas, plasma, vapor, during the vapor deposition process. Also, a process may contain a purge gas or a carrier gas and not contain a reactive compound.

A "substrate surface," as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride, aluminum, copper, or any other conductor or conductive or non-conductive barrier layer useful for device fabrication. Substrates may have various dimensions, such as 200 mm or 300 mm diameter wafers, as well as, rectangular or square panes. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers, III-V materials such as GaAs, GaN, InP, etc. and patterned or non-patterned wafers. Substrates may be exposed to a pretreatment process to polish, etch, reduce, oxidize, hydroxylate, anneal and/or bake the substrate surface.

In some embodiments, the invention features the use of a compound having a formula represented by:

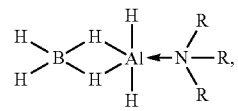

wherein each R is independently C1-C6 alkyl. In some embodiments, one or more of the R groups may be hydrogen.

In embodiments, where all R groups are methyl, the compound is known as trimethyl amine alane borane (also known as "TMAAB"). Embodiments relating to where R is not methyl will be referred to as "TMAAB derivatives." In embodiments, where TMAAB or a TMAAB derivative is utilized, the film may further comprise boron. TMAAB or a TMAAB derivative may be used as either an alane-containing precursor, or may be used alone with the metal precursor to deposit an aluminum alloy film.

Accordingly, another aspect of the invention pertains to a method of depositing an aluminum alloy film, the method comprising exposing a substrate surface to a metal precursor comprising a metal halide selected from $TiCl_4$, $TaCl_5$ and $HfCl_4$ to provide a metal halide terminated substrate surface; and exposing the substrate surface to trimethyl amine alane borane. General process conditions may follow any of those outlined above. In one or more embodiments, the deposited film comprises TiAl, TaAl, or HfAl. In one or more embodiments, the film further comprises boron. In some embodiments, the aluminum alloy film may further comprise boron. The substrate surface may be exposed to TMAAB or a TMAAB derivative and metal precursor either simultaneously or substantially simultaneously. As used herein, the term "substantially simultaneously" means that a majority of the flow of one component overlaps with the flow of another, although there may be some time where they are not co-flowed. In other embodiments, the substrate surface may be exposed to TMAAB or a TMAAB derivative and metal precursor either sequentially or substantially sequentially. As used herein, "substantially sequentially" means that a majority of the flow of one component does not coincide with the flow of another, although there may be some overlap.

In an exemplary process of this aspect, a substrate surface may be exposed to $TiCl_4$ and TMAAB (or a TMAAB derivative) sequentially to deposit a film comprising TiAl. In some embodiments, the film further comprises boron.

In some embodiments, one or more layers may be formed during a plasma enhanced atomic layer deposition (PEALD) process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, it should be noted that plasmas are not be required.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing apparatus is disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate must be moved relative to the gas distribution plate, or vice-versa.

One or more embodiments of the films provided by the processes described above are suitable as tunable N-metal films. The work functions of the films are tunable from quarter gap to band edge. The work function may be tuned by controlling the thickness of the film, or by increasing/decreasing the concentration of electronegative species. Work function tuning can be accomplished by doping with electronegative species (i.e., B, C, N, O, Cl, F) or silicon. Any suitable methods known in the art may be utilized to accomplish doping.

cap layers are conformal layers comprising one or more of TaN, TiN and TiN, and may be doped with Si, Al, C, O or W. In one or more embodiments, the cap layers are conformal layers comprising one or more of WN, WCN, W and Co. In some embodiments, the work function material has a thickness ranging from about 15, 20, 25, or 30 A to about 35, 40 or 45 A.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

EXAMPLES

Several films comprising TiAl were deposited using $TiCl_4$ and TMAAB. They were deposited according to the conditions in Table 2 below. Table 2 also shows the several resulting properties of the film.

TABLE 2

| Temp | TMAAB time | flow | TiCl4 time | flow | # of cycle | Rs center | TH center | Resistivity center | Ti/Al ratio center |
|---|---|---|---|---|---|---|---|---|---|
| 125 | 10 | 500 | 20 | 50 | 10 | 249 | 82.9 | 206 | 0.63 |
| 125 | 5 | 500 | 20 | 50 | 10 | 8096 | 71.6 | 5797 | 1.69 |
| 125 | 15 | 500 | 20 | 50 | 10 | 780 | 102.8 | 802 | 0.54 |
| 125 | 10 | 200 | 20 | 50 | 10 | 11766 | 67.01 | 7884 | 1.96 |
| 125 | 10 | 800 | 20 | 50 | 10 | 260 | 82.2 | 214 | 0.65 |
| 125 | 10 | 500 | 10 | 50 | 10 | 350 | 70.44 | 247 | 0.63 |
| 125 | 10 | 500 | 30 | 50 | 10 | 411 | 84.27 | 346 | 0.90 |
| 150 | 10 | 500 | 20 | 50 | 10 | 326 | 79.4 | 259 | 0.90 |
| 150 | 5 | 500 | 20 | 50 | 10 | 3679 | 67.2 | 2472 | 1.85 |
| 150 | 15 | 500 | 20 | 50 | 10 | 205 | 100.7 | 206 | 0.69 |
| 150 | 10 | 200 | 20 | 50 | 10 | 6889 | 63.8 | 4395 | 2.15 |
| 150 | 10 | 800 | 20 | 50 | 10 | 271 | 84.2 | 228 | 0.81 |
| 150 | 10 | 500 | 10 | 50 | 10 | 356 | 72.55 | 258 | 0.79 |
| 100 | 10 | 500 | 20 | 50 | 20 | 75.5 | 197 | 149 | 0.54 |
| 100 | 5 | 500 | 20 | 50 | 20 | 899 | 150 | 1349 | 1.53 |
| 100 | 15 | 500 | 20 | 50 | 20 | 39.3 | 217 | 85 | 0.40 |
| 100 | 10 | 200 | 20 | 50 | 20 | 1860 | 141 | 2623 | 2.23 |
| 100 | 10 | 800 | 20 | 50 | 20 | 96.6 | 170 | 164 | 0.63 |
| 100 | 10 | 500 | 10 | 50 | 20 | 75.7 | 197 | 149 | 0.61 |

As described above, because the volume available for low resistivity fill is limited, lower resistivity of the work function materials is desired. In one or more embodiments, the N-metals provided allow for lower resistivity, and thus use of thinner layers. The thickness of the cap layers may also be of importance. Typical cap layers have a work function between midgap and PMOS band edge. In one or more embodiments, the As can be seen from Table 1, the process can result in TiAl films having a varying Ti/Al ratio. Additionally, resistivities below 250 μΩ-cm can be achieved.

Figure 1B:
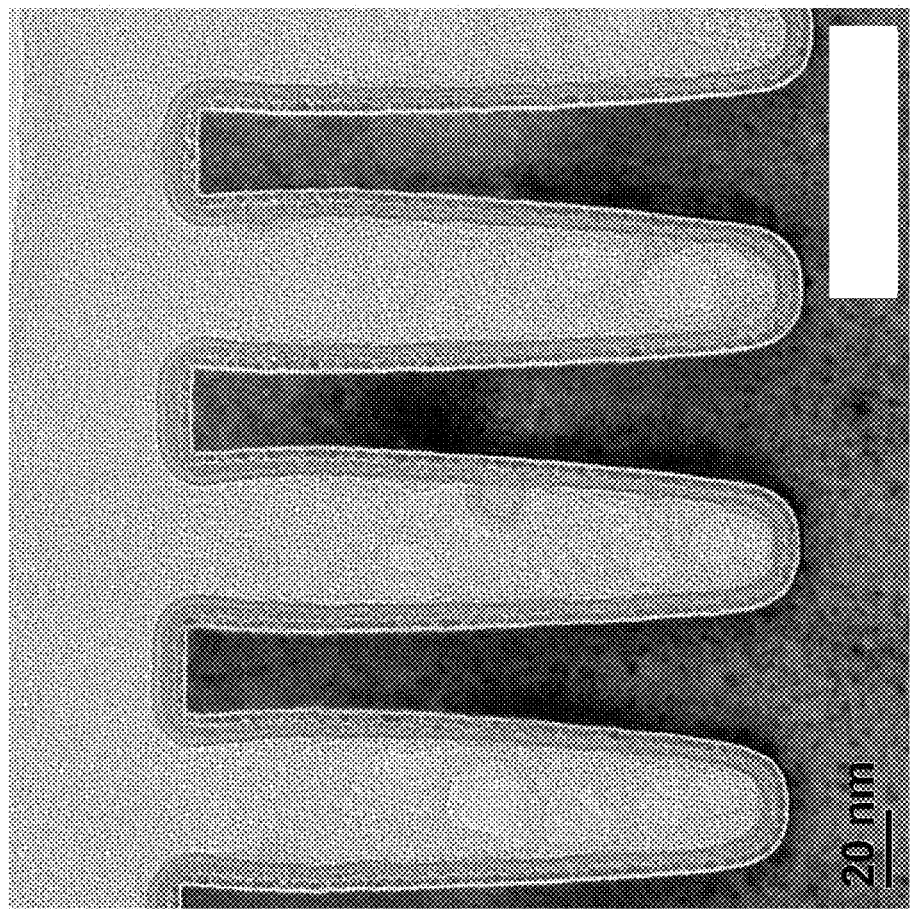
Figure 1C:
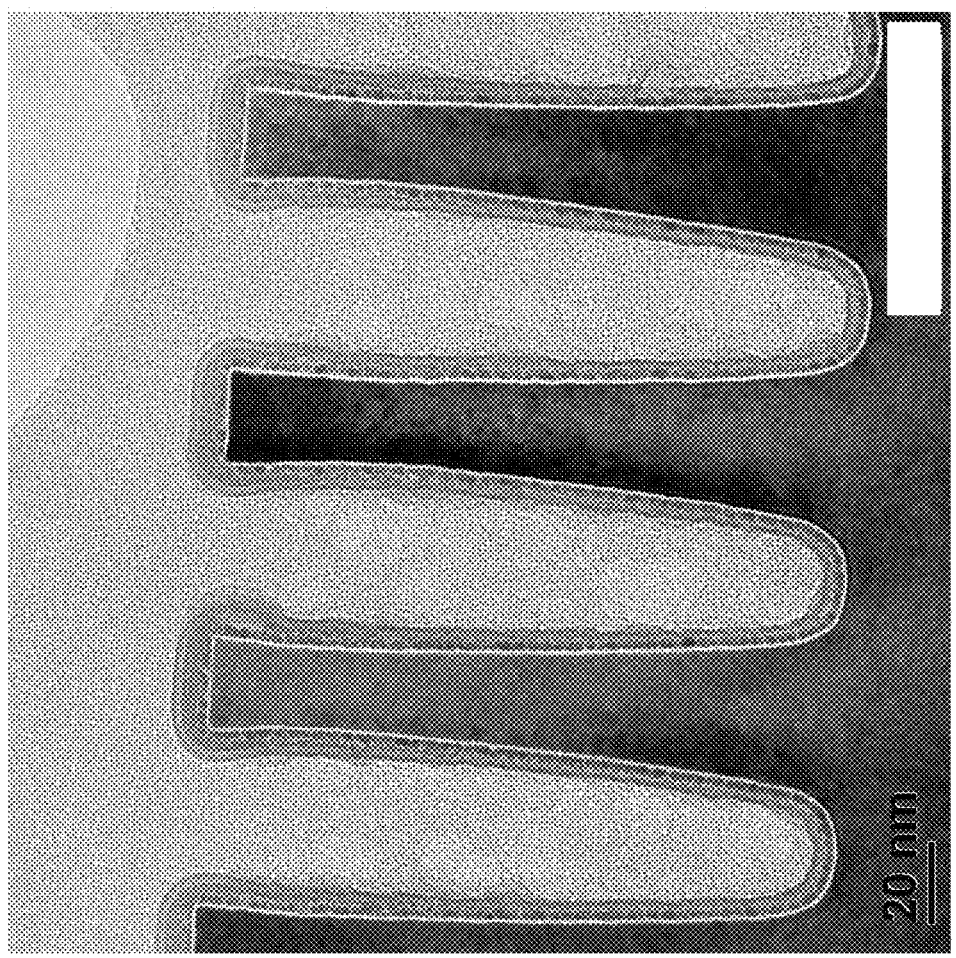

Three transmission electron microscope images (TEM) are shown in FIGS. 1A-C. FIG. 1A shows step coverage of the film deposited at 100° C., FIG. 1B shows step coverage of the film deposited at 125° C. and FIG. 1C shows step coverage of the film deposited 150° C. As demonstrated in all three figures, the step coverage with all three temperatures is very good. The films are smooth and highly conformal.

Figure 2A:
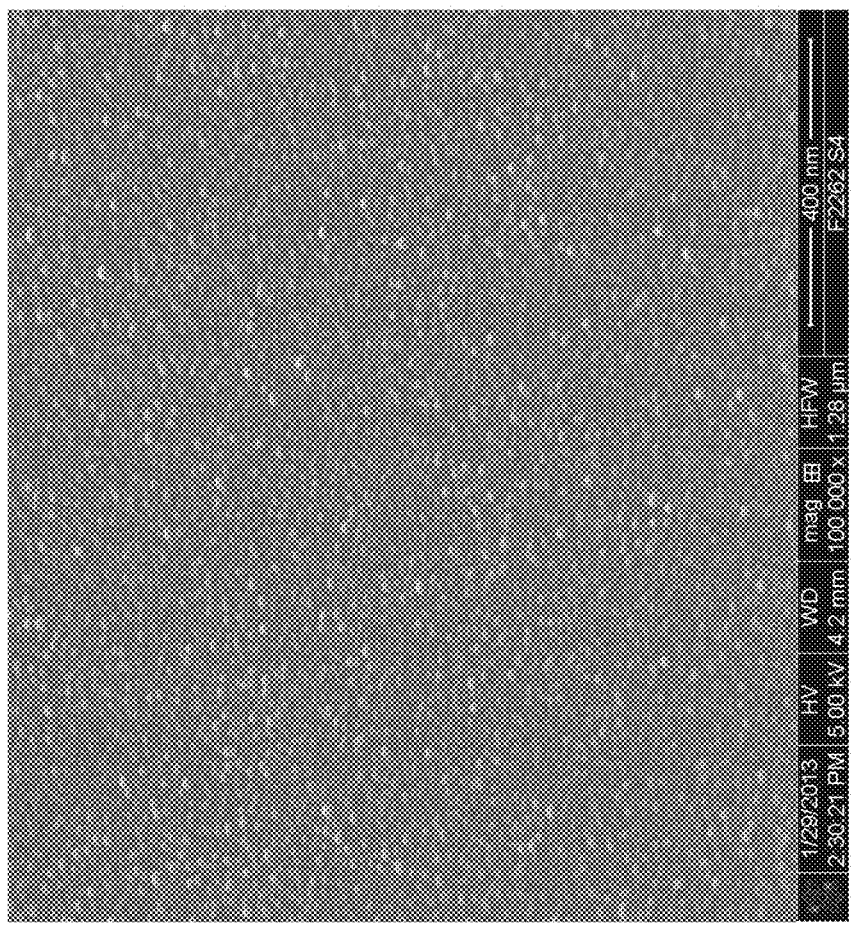
FIGS. 2A-C are a SEM images of films deposited according to one or more embodiments of the invention.
Figure 2B:
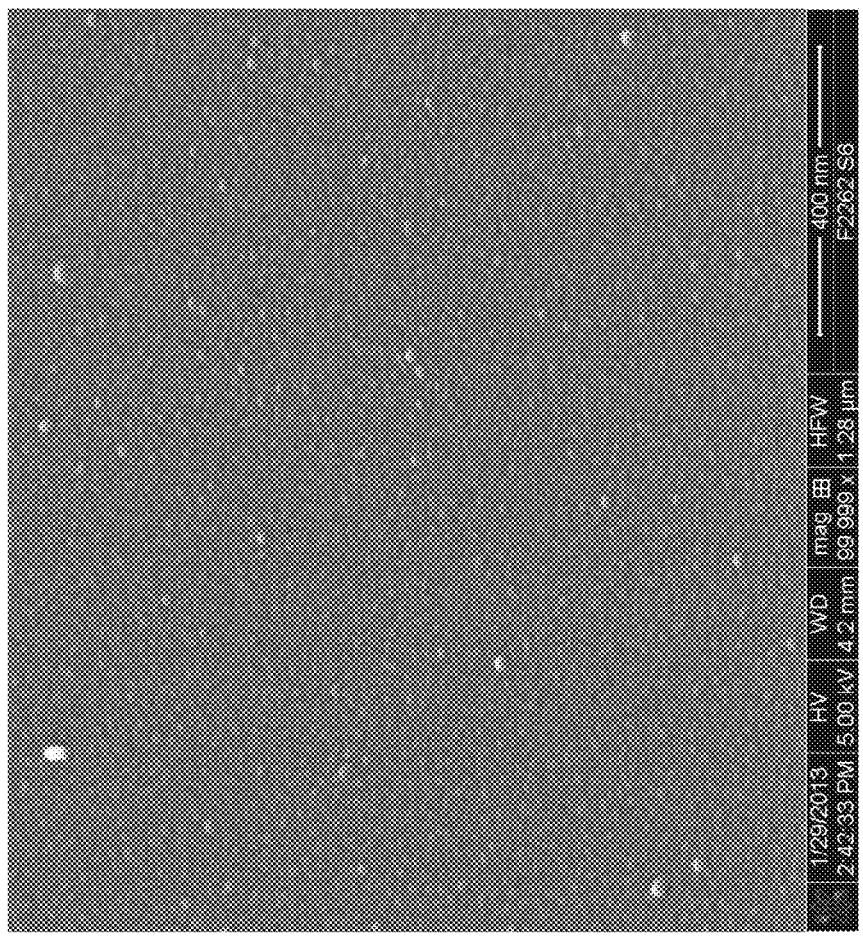
Figure 2C:
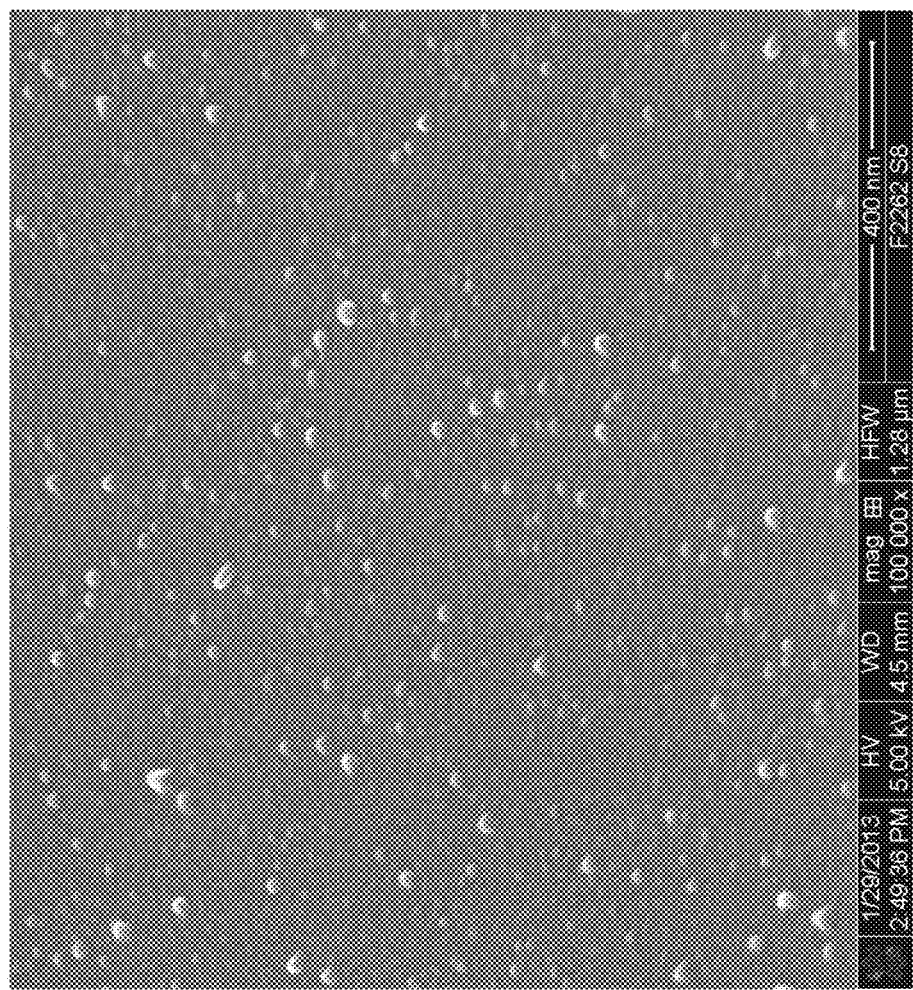

Three scanning electron microscope images (SEM) are shown in FIGS. 2A-C. FIG. 2A shows smoothness of the film deposited at 100° C., FIG. 2B shows smoothness of the film deposited at 125° C. and FIG. 2C shows smoothness of the film deposited at 150° C. As seen in all three figures, the smoothness is very good at varying temperatures.

Figure 3A:
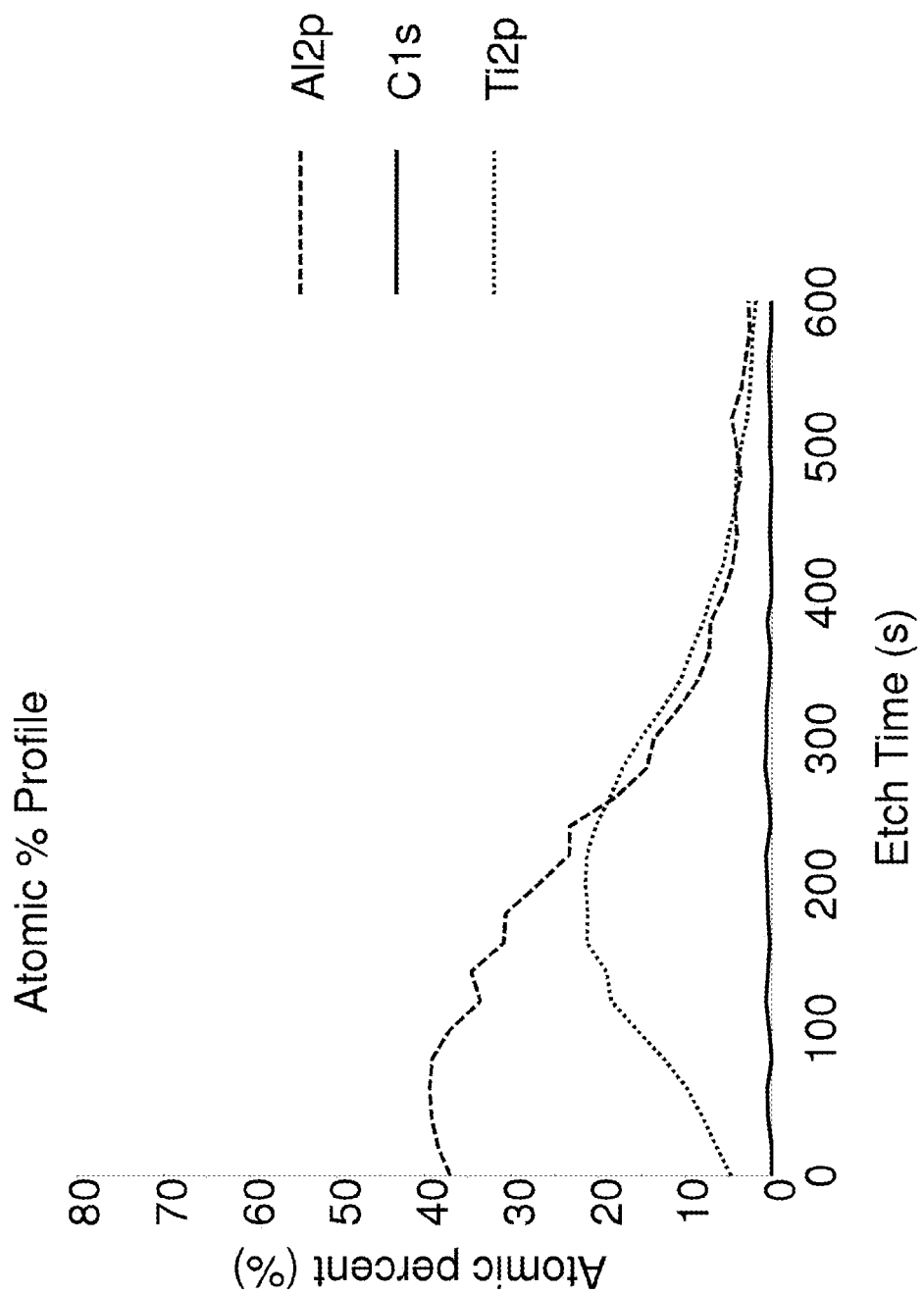
FIGS. 3A-C show the elemental content of a film deposited according to one or more embodiments of the invention.
Figure 3B:
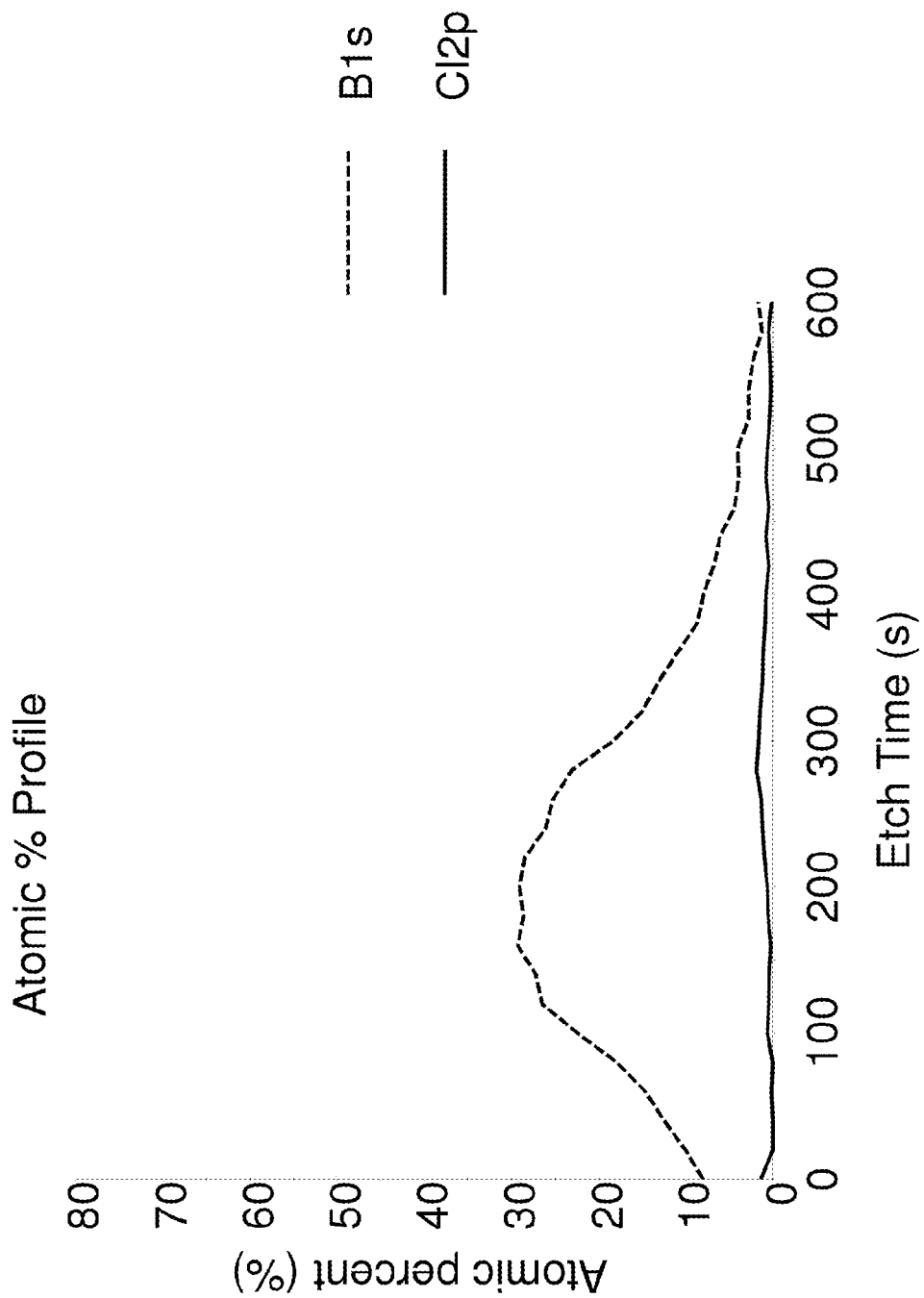
Figure 3C:
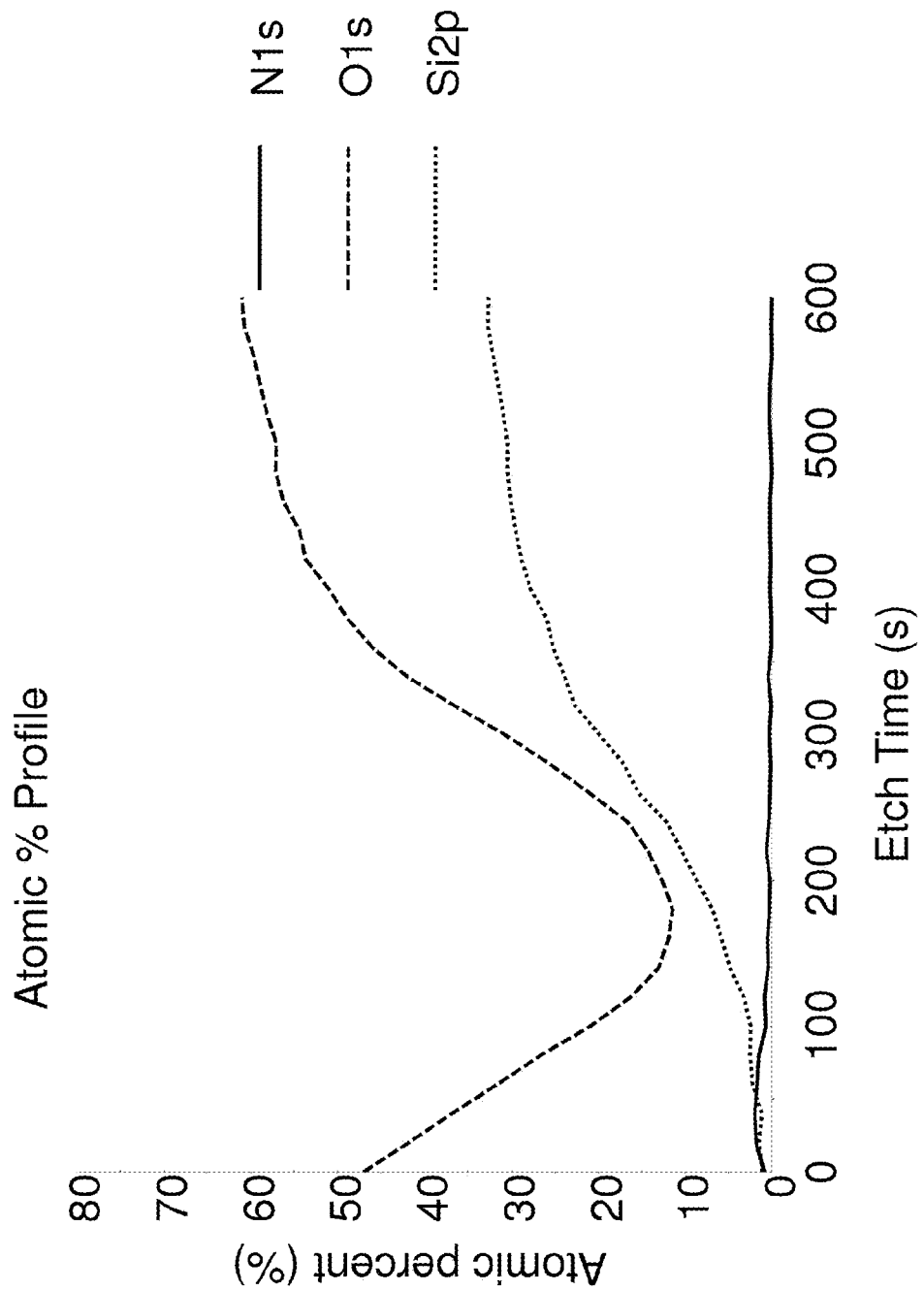

X-Ray photoelectron spectroscopy (XPS) data was collected for several of the films, as shown below in Table 3 below. Additionally, the atomic percent profile for the film deposited at 125° C. is shown in FIGS. 3A-C. The spectra has been divided among three figures to better show the traces of the individual elements. As can be seen from the table and figures, the deposited films contain little carbon. While not wishing to be bound to any particular theory, it is thought that the oxygen content is higher than it should be because only 70 Angstroms of thickness were analyzed.

TABLE 3

|  | Al2p | B1s | C1s | Cl2p | N1s | O1s | Si2p | Ti2p | Ti/Al ratio |
|---|---|---|---|---|---|---|---|---|---|
| TiAl 70A at 75° C. | 32.3 | 9.1 | 0.0 | 0.7 | 5.0 | 35.9 | 5.8 | 11.2 | 0.34 |
| TiAl 70A at 125° C. | 30.7 | 28.9 | 0.3 | 0.4 | 0.4 | 11.7 | 6.3 | 21.2 | 0.69 |
| TiAl 70A at 150° C. | 28.3 | 34.2 | 0.4 | 0.3 | 0.4 | 7.7 | 5.0 | 23.7 | 0.83 |
| TiAl 70A at 150° C. w/o ANL | 27.3 | 34.1 | 0.2 | 0.3 | 0.2 | 8.5 | 5.4 | 24.0 | 0.88 |
| TiAl 70A at 100° C. | 30.5 | 22.6 | 0.7 | 0.7 | 0.7 | 19.1 | 7.2 | 18.4 | 0.60 |

What is claimed is:

1. A method of depositing an aluminum alloy film by atomic layer deposition (ALD), the method comprising:
exposing a substrate surface to a metal halide precursor comprising a metal halide selected from $TiCl_4$, $TaCl_5$ and $HfCl_4$ to provide a metal halide at the substrate surface;
purging metal halide;
exposing the metal halide at the substrate surface to an alkyl aluminum precursor comprising one or more of dimethylaluminum hydride, diethylhydridoaluminum, methyldihydroaluminum, or an alkyl aluminum hydrides of the formula $[(C_xH_y)_{3-a}AlH_a]_n$, wherein x has a value of 1 to 3, y has a value of 2x+2, a has a value of 1 to 2, and n has a value of 1 to 4; and
exposing the substrate surface to an alane-containing precursor comprising one or more of dimethylethylamine alane, methylpyrrolidinealane, di(methylpyrolidine) alane, or a compound having formula

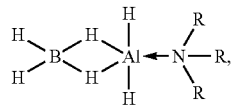

wherein each R is independently C1-C6, to provide an aluminum alloy film consisting essentially of TiAl, TaAl, or HfAl, and less than 10% carbon.

2. The method of claim 1, wherein the exposure of the substrate surface to the alkyl aluminum precursor at least partially overlaps with the exposure of the substrate surface to the alane-containing precursor.

3. The method of claim 1, further comprising purging the alkyl aluminum precursor before exposing the substrate surface to an alane-containing precursor.

4. The method of claim 1, further comprising exposing the substrate surface to an amine, wherein the substrate surface is exposed to the amine while the substrate surface is exposed to the alkyl aluminum and/or the alane-containing precursor.

5. The method of claim 1, further comprising soaking the aluminum alloy film with an alloying agent, wherein the alloying agent comprises one or more of $SiH_4$, $GeH_4$, trimethylgallium, and $B_2H_6$.

6. The method of claim 1, further comprising exposing the substrate surface to a fourth precursor comprising one or more of dimethylethylamine, dimethylcyclohexylamine or pyrrolidine alane during exposure of the substrate to the third precursor.

7. The method of claim 1, wherein exposure of the substrate surface to the alkyl aluminum precursor occurs before exposure of the substrate surface to the alane-containing precursor.

8. The method of claim 1, wherein exposure of the substrate surface to the alkyl aluminum precursor occurs after exposure of the substrate surface to the alane-containing precursor.

9. A method of depositing an aluminum alloy film, the method comprising:
exposing a substrate surface to a metal precursor comprising a metal halide selected from $TiCl_4$, $TaCl_5$ and $HfCl_4$ to provide a metal halide terminated substrate surface;
purging unreacted metal halide from the chamber;
exposing the metal halide terminated substrate surface to an alkyl aluminum precursor, the alkyl aluminum precursor comprising one or more of dimethylaluminum hydride, diethylhydridoaluminum, methyldihydroaluminum, and alkyl aluminum hydrides of the following formula $[(C_xH_y)_{3-a}AlH_a]_n$, wherein x has a value of 1 to 3, y has a value of 2x+2, a has a value of 1 to 2, and n has a value of 1 to 4; and
exposing the substrate surface to an alane-containing precursor comprising one or more of dimethylethylamine alane, di(methylpyrolidine)alane and methylpyrrolidinealane to provide an aluminum alloy film consisting essentially of TiAl, TaAl, or HfAl, and less than 10% carbon.

10. The method of claim 9, wherein the alane-containing precursor is deposited directly on the metal halide terminated substrate surface, followed by soaking the metal halide terminated substrate surface with the alkyl aluminum precursor to increase the Al content of the layer.

11. The method of claim 9, wherein exposure to the alkyl aluminum precursor and alane-containing precursor occurs simultaneously.

12. The method of claim 9, further comprising exposing the substrate surface to an amine, wherein the substrate surface is exposed to the amine while the substrate surface is exposed to the alkyl aluminum and/or the alane-containing precursor.

13. The method of claim 9, further comprising soaking the aluminum alloy film with an alloying agent, wherein the alloying agent comprises one or more of $SiH_4$, $GeH_4$, trimethylgallium, and $B_2H_6$.

14. The method of claim 9, further comprising exposing the substrate surface to a fourth precursor comprising one or more of dimethylethylamine, dimethylcyclohexylamine or pyrrolidine alane during exposure to of the substrate to the third precursor.

15. A method of depositing an aluminum alloy film by atomic layer deposition (ALD), the method comprising:
 a. exposing a substrate surface to a metal precursor comprising a metal halide selected from $TiCl_4$, $TaCl_5$ and $HfCl_4$ to provide a metal halide terminated substrate surface;
 b. purging metal halide; and
  exposing the metal halide terminated substrate surface to a compound having a structure represented by:

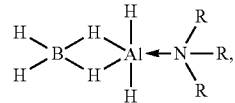

wherein each R is independently C1-C6, and wherein the deposited aluminum alloy film comprises TiAl, TaAl, or HfAl, and less than 10% carbon.

16. The method of claim 15, wherein each R group is methyl, and the compound is trimethyl amine alane borane.

17. The method of claim 15, wherein the deposited film further comprises boron.

18. The method of claim 15, wherein the metal precursor comprises $TiCl_4$, and the aluminum alloy film comprises TiAl.

* * * * *